(12) United States Patent
Schie et al.

(10) Patent No.: US 10,509,749 B2
(45) Date of Patent: Dec. 17, 2019

(54) DIRECT DRIVE LED DRIVER AND OFFLINE CHARGE PUMP AND METHOD THEREFOR

(71) Applicants: David Schie, Cupertino, CA (US); Mike Ward, Tallmadge, OH (US)

(72) Inventors: David Schie, Cupertino, CA (US); Mike Ward, Tallmadge, OH (US)

( * ) Notice: Subject to any disclaimer, the term of this patent is extended or adjusted under 35 U.S.C. 154(b) by 0 days.

(21) Appl. No.: 16/167,147

(22) Filed: Oct. 22, 2018

(65) Prior Publication Data

US 2019/0155773 A1 May 23, 2019

Related U.S. Application Data

(62) Division of application No. 15/582,127, filed on Apr. 28, 2017, now Pat. No. 10,146,713, which is a division of application No. 13/930,759, filed on Jun. 28, 2013, now Pat. No. 9,673,310.

(60) Provisional application No. 61/665,864, filed on Jun. 28, 2012.

(51) Int. Cl.
| | |
|---|---|
| H03K 19/082 | (2006.01) |
| G06F 13/28 | (2006.01) |
| G06F 13/40 | (2006.01) |
| H02M 3/07 | (2006.01) |
| H05B 33/00 | (2006.01) |
| H03K 19/177 | (2006.01) |

(52) U.S. Cl.
CPC .......... *G06F 13/28* (2013.01); *G06F 13/4009* (2013.01); *H02M 3/07* (2013.01); *H05B 33/00* (2013.01); *H03K 19/177* (2013.01)

(58) Field of Classification Search
None
See application file for complete search history.

(56) References Cited

U.S. PATENT DOCUMENTS

| | | | | |
|---|---|---|---|---|
| 5,349,213 A | * | 9/1994 | Bauer | ................. H01L 29/7455 257/139 |
| 5,498,884 A | * | 3/1996 | Ajit | ..................... H01L 29/7455 257/132 |
| 8,093,107 B1 | * | 1/2012 | Nemati | ................... G11C 11/39 257/E21.388 |

(Continued)

*Primary Examiner* — Anh Q Tran
(74) *Attorney, Agent, or Firm* — Weiss & Moy, P.C.; Jeffrey D. Moy

(57) ABSTRACT

In one embodiment, a Light Emitting Diode (LED) driving device for driving a plurality of LEDs has a switching matrix utilizing a plurality of one of a turn off thyristors or turn off triacs coupled to the plurality of LEDs. A controller is coupled to the switching matrix responsive to a voltage of a rectified AC halfwave, wherein combinations of the plurality of LEDs are altered to ensure a maximum operating voltage of the plurality of LEDs is not exceeded. A current limiting device is coupled to the combinations of the plurality of LED to regulate current.
In a second embodiment an offline charge pump utilizes a switching matrix to recombine capacitors in accordance with the voltage on the AC half wave and then in accordance with a desired output voltage to feed a load, such that said recombinations occur at a frequency much higher than the frequency of the AC rectified half wave such that charge is "pumped" from the input at one voltage to the output at another voltage through the AC halfwave while providing a constant output voltage to the load.

5 Claims, 13 Drawing Sheets

(56) References Cited

U.S. PATENT DOCUMENTS

2008/0002463 A1\* 1/2008 Sugizaki ............... G11C 11/417
365/177

\* cited by examiner

MCT Equivalent Circuit

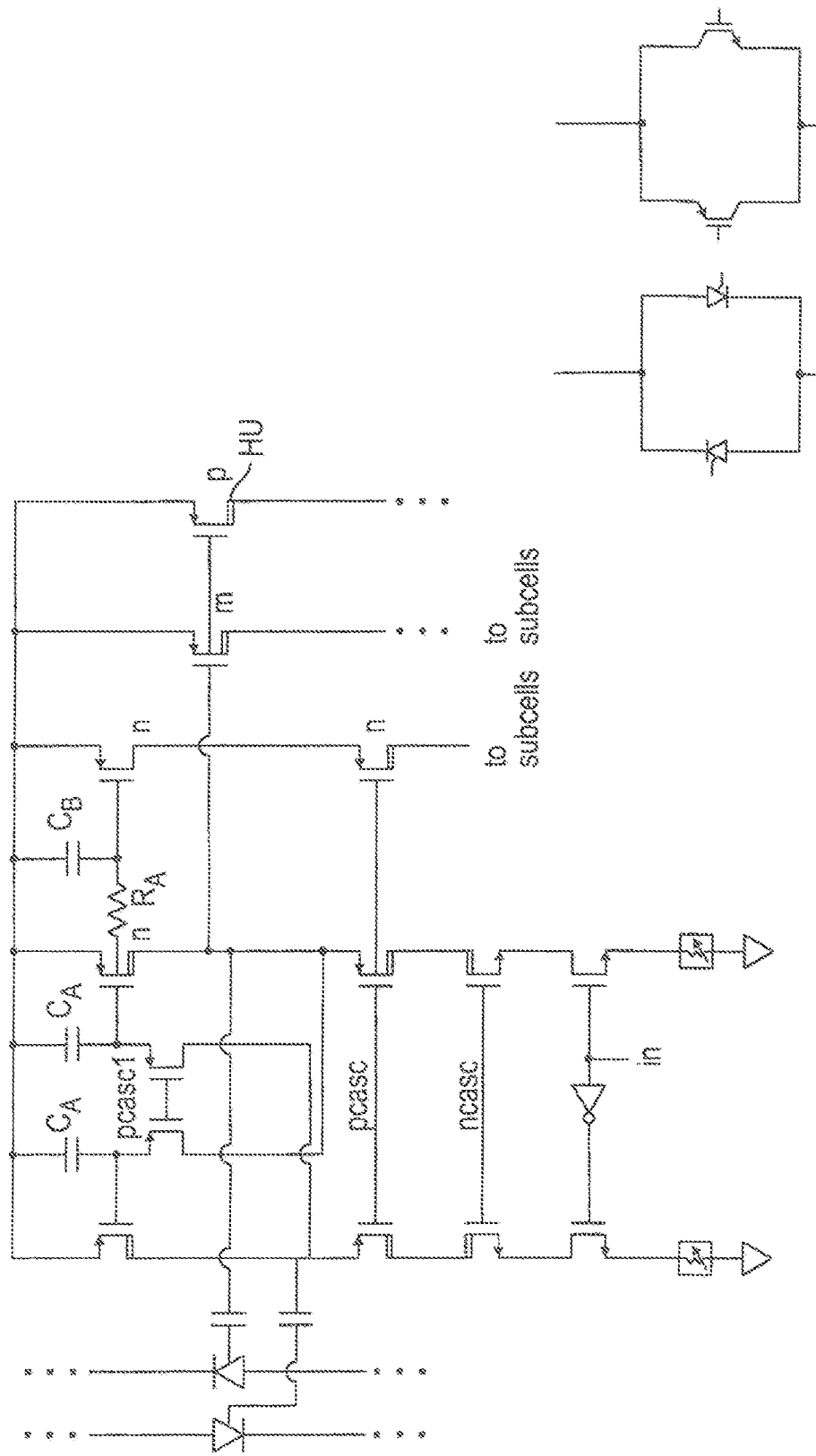

| Application Area | Use of Device | Advantage | Example Circuit Board |
|---|---|---|---|
| Battery Backup Commercial | AC Divider or 50/60Hz Transformer Replacement Switching Supplies (Non-Isolated) | Lower Cost Less Complexity & No EMI Issues vs. Switcher Lighter than Transformer 120/277V Tap Returns Eliminated vs. AC Divider | |
| White Goods | AC Divider or 50/60Hz Transformer Replacement Switching Supplies (Non-Isolated) | Lower Cost Less Complexity & No EMI Issues vs. Switcher Lighter than Transformer | |
| Capacitor Isolation or Fuse Isolated Wall Adaptors | Switching Power Supply for Cell Phones, IPODs, etc. (Isolated) | Lower Cost Smaller Size No EMI Components or Housing | |

FIG. 11

DIRECT DRIVE LED DRIVER AND OFFLINE CHARGE PUMP AND METHOD THEREFOR

RELATED APPLICATIONS

This application is a divisional of and claims priority to U.S. patent application Ser. No. 15/582,127, filed Jun. 28, 2013 which is a divisional of and claims priority to U.S. patent application Ser. No. 13/930,759, filed Jun. 28, 2013, which are incorporated herein by reference. This application is further related to U.S. Provisional Application Ser. No. 61/665,864, filed Jun. 28, 2012, in the name of the same inventor listed above, and entitled, "DIRECT DRIVE LED DRIVER & OFFLINE CHARGE PUMP", the present patent application claims the benefit under 35 U.S.C. § 119(e).

TECHNICAL FIELD

This application generally relates to a Light Emitting Diode (LED) driver, and more particularly, to an improved direct drive LED driver and in an alternative embodiment to an offline charge pump capable of creating a constant output voltage to drive LEDs or other loads requiring a constant output voltage.

BACKGROUND

Direct drive schemes have been popular recently to power solid state lighting, such as Light Emitting Diode (LED) light bulbs, to avoid the cost or complexity of switching regulators which bring with them unwanted EMI filter and bill of material expenses. Various direct drive schemes have been suggested, however, they generally include utilizing several subsets of one or more series connected LEDs which are shorted or bypassed by switches to increase or decrease the total forward voltage in proportion to the AC input. Normally the switches used are MOSFETs which are turned on or off depending upon the AC input voltage at the time.

To improve power factor and reduce total harmonic distortion (THD), these types of switching schemes are used in conjunction with valley fill power factor correction schemes (VFPFC). These schemes break up the input capacitor into two or more capacitors so as to alter the effective input and discharge capacitance so as to distribute the input conduction angle over a wider range and spread the capacitance discharge over a wider conduction angle.

Unfortunately, these schemes underutilize expensive LEDs because many of them are only on for a portion of the conduction cycle rather than continuously as with more expensive switching regulator based schemes. Additionally, these schemes are not useful for voltage mode applications such as cell phone or portable equipment chargers which require a constant average output voltage.

Standard wall dimmers create phase control type dimming that is difficult to correlate with direct drive schemes since direct drive requires a continuous half wave rectified signal to make good use of the LEDs. Valley fill Power Factor Correction (PFC) schemes are poorly compatible with these types of schemes since they are generally passive or minimally active and not responsive to phase control type signals. Most direct drive schemes working with phase control dimmers will turn on only a small fraction of the available LEDs leaving much of a luminaire unilluminated. The eye is generally dissatisfied with the resulting bright spot in the luminaire rather than a continuous dimming across all of the LEDs in the physical LED array.

The basic limitation on improving the utilization of LEDs, or allowing more complex offline capacitor schemes is the cost of the switches. MOSFETs are expensive especially at high voltage and therefore much emphasis is placed on reducing the voltage on each MOSFET and in addition reducing the number of switches. This results in a number of problems including flicker, poor total harmonic distortion (THD), EMI, poor LED utilization & reduced power factor. More switches would reduce flicker, allow better power factor, improve total harmonic distortion (THD) & LED utilization, and reduce use of capacitors. Therefore, it would be desirable to have a mechanism that maximizes the conduction time of all LEDs. It would be especially desirable if it were also compatible with phase control dimming.

Alternatively, a mechanism compatible with a fixed voltage output by connecting capacitors groups in conformance with the rectified AC input voltage which switches said capacitors at frequencies much higher than the input sine wave frequency, from a series-parallel arrangement compatible with the instantaneous input voltage, to a series-parallel configuration compatible with an output or load voltage, would be desirable. Such an offline charge pump configuration compatible with portable equipment such as power supply or charger circuits also known as "wall warts," common for cell phones, tablets or laptop computers, could greatly reduce the cost, size, component count, weight and overcome EMI disadvantages of existing circuits.

It would be desirable to have a switching matrix with superior properties to MOSFETs, bipolar transistors or even insulated gate bipolar transistors (IGBTs) such that more complex switching matrix for LEDs or capacitors might be utilized at reasonable cost. The best devices in terms of current density (see FIG. 9) are thyristors. These thyristors, however, must be capable of turning on and off without relying on the current to fall to zero as in normal thyristor circuits. This is accomplished utilizing Gate Turn Off (GTO) thyristors and/or Mos Controlled Thyristors (MCT) which can be turned off in response to a control signal.

Commercially available GTO and thyristors are only available in individual vertical form and generally only at high current levels. Additionally, no arrays or groups of turn off thyristors on the same silicon substrate which are isolated relative to one another have been demonstrated. The use of turn off thyristors for offline voltage mode applications requires such isolated devices as creating a substrate or package capable of dealing with multiple potentials is too expensive for offline LED drivers or power supplies. It would therefore be desirable to have a switch matrix based on turn off thyristors such as GTOs/MCTs/turn off TRIACs that can be made on a single piece of silicon as a switching array at low cost.

Finally, it would be desirable to have a scheme for level shifting the control signals that drive the control nodes of said, turn off thyristors individually or in combinations of two in reverse parallel configuration (turn off TRIACs) such that the voltage and current limits on said control nodes are maintained (i.e. Safe Operating Area (SOA)) while simultaneously eliminating the need for high valued resistor based schemes with long time constants which reduce the number of times per cycle that switching can occur.

Therefore, a need exists to provide a device and method to overcome the above problems.

SUMMARY OF THE INVENTION

A Light Emitting Diode (LED) driving device for driving a plurality of LEDs has a switching matrix utilizing a plurality of one or more of a turn off thyristors or turn off triacs coupled to the plurality of LEDs. A controller is coupled to the switching matrix responsive to a voltage of a rectified AC halfwave, wherein combinations of the plurality of LEDs are altered to ensure a maximum operating voltage of the plurality of LEDs is not exceeded. A current limiting device is coupled to the combinations of the plurality LED to regulate current.

An offline charge pump device has a switched capacitor array having a plurality of capacitors using one or more of turn off thyristors or parallel reverse combinations as switches to create a turn off TRIAC connecting at least two of the plurality of capacitors. A controller device operating at a frequency higher than an AC rectified half wave is coupled to the switched capacitor array responsive to a voltage of the rectified AC half wave. The controller device forms capacitor combinations from the plurality capacitors such that the capacitor combinations do not exceed their individual maximum voltage ratings during a first part of a frequency cycle. The controller device rearranges the capacitor combination resulting in a desired output voltage during a second part of the frequency cycle (said frequency cycle much higher than the rectified AC half wave frequency). A coupling device is used for connecting the plurality of capacitors by the turn off thyristors to the voltage of the AC half wave during the first part of the frequency cycle and then to an output during the second part of the frequency cycle.

A capacitor device may be multiple individual capacitors or a single capacitor with a plurality of accessible plate members. The plurality of plate members are separately segmented out to, create a series combination of capacitors, wherein each capacitor has a lower voltage tolerance than across the entire series combination.

A vertical thyristor array has a plurality of one or more of a MCT or GTO thyristors. The plurality of one or more of a MCT or GTO thyristors are formed on a common substrate, with one of a common anode or cathode connected to the common substrate, for all plurality of one of a MCT or GTO thyristors in the array.

The features, functions, and advantages may be achieved independently in various embodiments of the disclosure or may be combined in yet other embodiments.

BRIEF DESCRIPTION OF DRAWINGS

The novel features believed to be characteristic of the application are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The application itself, however, as well as a preferred mode of use, further objectives and advantages thereof, will be best understood by reference to the following detailed description of illustrative embodiments when read in conjunction with the accompanying drawings, wherein;

FIG. 8 shows a driver for the MCT, GTO or linear/controlled turn off type devices;

FIG. 8A illustrates the concept of a turn off TRIAC utilizing gated turn off thyristor to control a bidirectional current;

FIG. 11 illustrates some applications in which an offline charge pump might be used and the advantages that would accrue.

DESCRIPTION OF THE APPLICATION

The description set forth below in connection with the appended drawings is intended as a description of presentlypreferred embodiments of the application and is not intended to represent the only forms in which the present application can be constructed and/or utilized. The description sets forth the functions and the sequence of steps for constructing and operating the application in connection with the illustrated embodiments. It is to be understood, however, that the same or equivalent functions and sequences can be accomplished by different embodiments that are also intended to be encompassed within the spirit and scope of this application.

Figure 9:
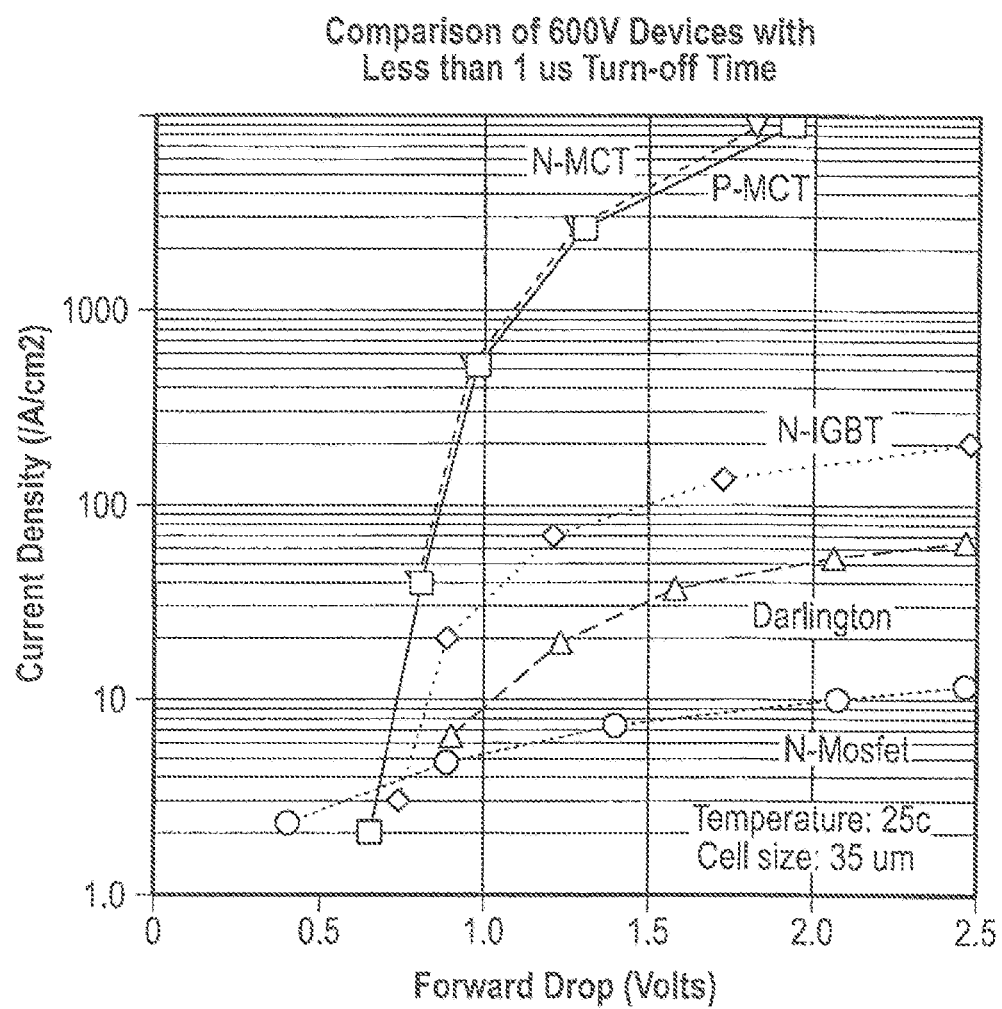
FIG. 9 illustrates how MCT's have a higher current density.

The invention utilizes turn off thyristors such as gate turn off thyristors (GTO) and/or Mos Controlled Thyristors (MCT) technology to lower the cost of switching and allow reverse blocking. Generally GTOs are known to have a current controlled control node and MCTs to have a voltage controlled control node. FIG. 9 illustrates the advantages of these types of switches (which have not been used for direct drive or offline charge pumps schemes before) over MOSFETs. FIG. 9 illustrates that MCTs have a higher current density which translates into less silicon. This differs from convention direct drive means which generally utilize external MOSFETs to short groups of LEDs during different segments of AC waveform. Simply utilizing these types of devices, however, may not be enough as it may be necessary to combine them on a single substrate while simultaneously isolating to make them useful, isolated arrays of these types of thyristors have not been taught before.

The invention may utilize capacitors, preferably a single capacitor with multiple plates bonded out for use in the switching, circuits, although multiple capacitors can also be used. The thickness between different plates may be altered to optimize the energy stored for different capacitor segments or may be of identical thickness but group different numbers of plates to store different quantities of energy. It may be useful to stagger the capacitance and turn on different size capacitors during various parts of the AC waveform. Alternatively groups of capacitors may be used. The scheme utilizes lower voltage capacitors in either scheme therefore the voltage across the capacitors must be compatible with the input voltage through the switching pattern. This lower voltage allows a conventional high voltage capacitor with multiple plates to be utilized simply by having access to the plates as long as the thickness (voltage) requirements are met at all times. In this scenario no additional capacitance and size or cost would be required beyond simply pinning out the plates independently.

The invention may utilize a turn off thyristor switching array to connect groups of LEDs in series, in groups of parallel LEDs in series or all LED in series. Turn off thyristors have not been used for this type of switching, however, they provide a cost effective way to do so versus MOSFETs which are expensive for offline switching and must be paired in DGD configuration to allow reverse blocking making them even more so.

Figure 10:
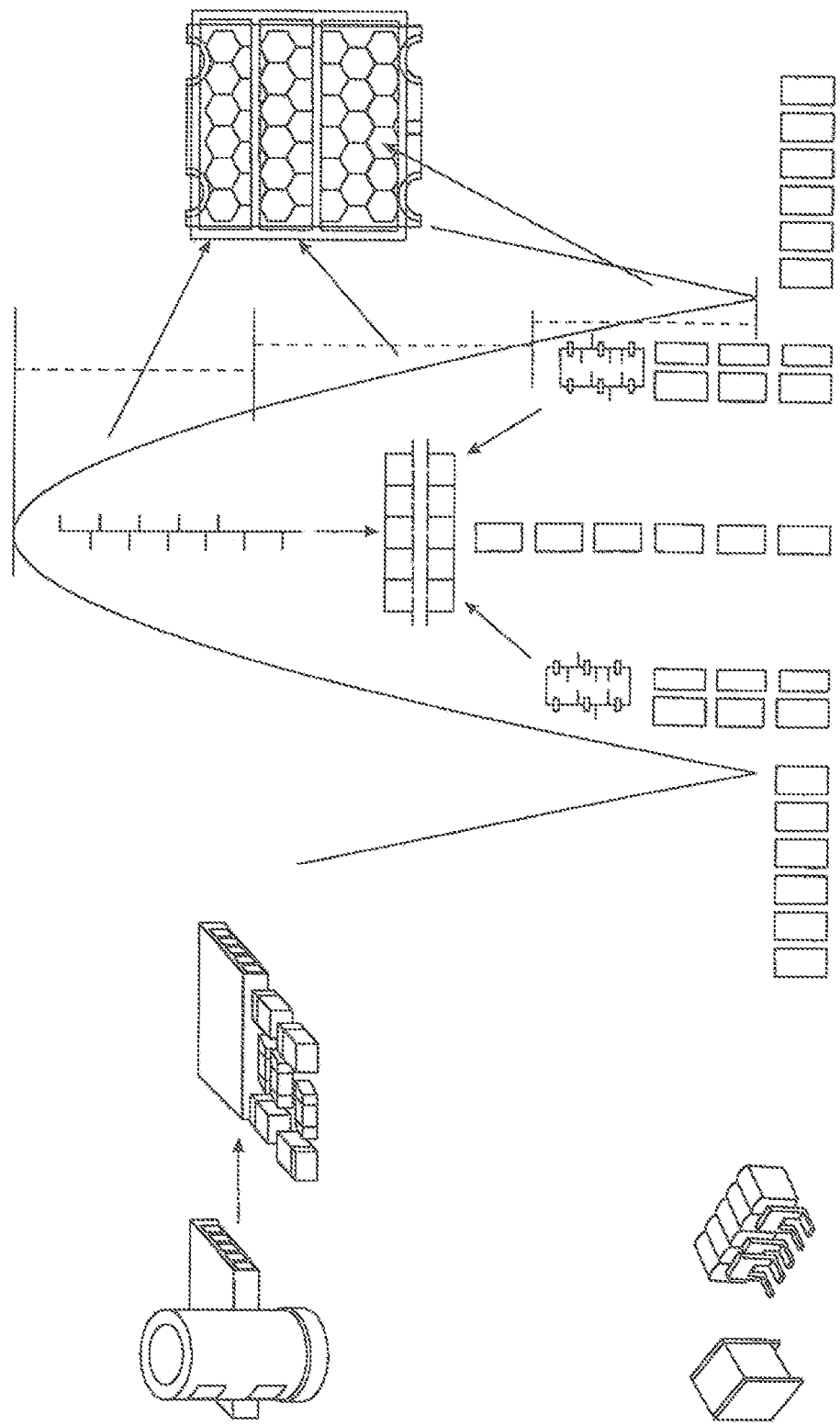
FIG. 10 illustrates operation of the offline charge pump where capacitors are arrayed in conformance with the rectified AC input voltage such that they may transition from an all series to all parallel combination, or a pattern of series-parallel to series-parallel combination so as to charge while maintaining a voltage across the capacitor which will not damage them and then rearranging to create an output voltage at a desired magnitude.

The capacitor switching regimen may be done in two different ways. The first is an offline charge pump where the equivalent capacitors are grouped according to the input waveform. When the voltage is very low they are all in parallel but are regrouped in series to charge up an output capacitor and power a load. When the voltage is very high they can all be in series and then switched into parallel combinations to match the desired output voltage. This scheme has the advantage of minimizing the quantity of switching required on the LEDs or other types of constant voltage loads since the output voltage may be maintained through the AC half cycle. FIG. 10 demonstrates the scheme graphically.

This scheme has the additional advantage of being compatible with voltage mode systems such that any input voltage may at first be connected in such a way as to be compatible with the input voltage and then rearranged so as to charge an output capacitor and feed a load which requires a different output voltage. The downside of this arrangement is that it must be switched regularly such that, the output capacitor and/or load may be kept charged to keep its size reasonable, at a frequency much higher than the AC rectified switching frequency.

In the alternative embodiment turn off thyristors are utilized to connect LEDs such that they may be used continuously in conjunction with valley fill PFC. In this case, however, the passive diodes used in a typical valley fill PFC scheme are replaced with turn off thyristors such that the valley fill PFC scheme may be accelerated to parallel the full input capacitance if phase control dimming is detected. This allows much more energy to be stored during the on time of the phase control dimming, especially extremely small phase angles, so that the system may be kept active.

In addition the valley fill PFC minimum level may be adjusted by choosing which groups of capacitor plates or which capacitors to utilize. This reduces the amount of capacitance required as smaller minimum voltages may be used in conjunction with the output switch array.

The numbers of switches required to implement these types of schemes are much larger than those typically used for direct drive or valley PFC schemes and have been uneconomical utilizing MOSFET technology. Turn off thyristors allow creation of much larger number of switches at much lower costs due to their unique structure which has a much higher current density than other devices (see FIG. 9), however, in the past they were still impractical because their vertical structures required isolated substrates which in turn demanded expensive hybrid assemblies incompatible with the very low cost expectations of offline LED drivers or power supplies.

Figures 2A, 2B, 2C, 2D, 2E, 2F, 2G, 2H, 2I:
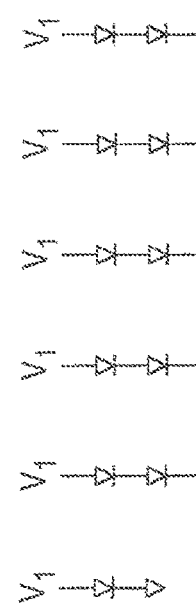
FIGS. 2A and 2B shows different schematic implementations of an embodiment of the switching matrix wherein the switches are connected to a single supply shorting unused LEDs to maintain a forward voltage in conformance with the input AC halfwave voltage.
FIG. 2C-2H show different configuration of the switching matrix shown in FIG. 2A-2B wherein switches are opened and or closed.
FIG. 2I shows a servo driven transconductor for use in the switching matrix of FIG. 2A or 2B.

To create a cost effective switch matrix it is necessary to create the switches on a common substrate. To do this two novel methods are introduced. The first method creates a group of switches with a common node. This is compatible with the LED driving scheme for example of FIG. 2 where n or p type turn off thyristors may be used to short across groups of LEDs to allow forward voltages for the remaining LEDs compatible with the input voltage. As the input voltage rises so additional LEDs are "freed" to increase the forward voltage. Even with this scheme additional current limiting means are anticipated which might be as simple as a resistor, or use of a linearly controllable turn off thyristor, or may include an additional servo driven transconductor (as shown in FIG. 2*b*).

Figure 7:
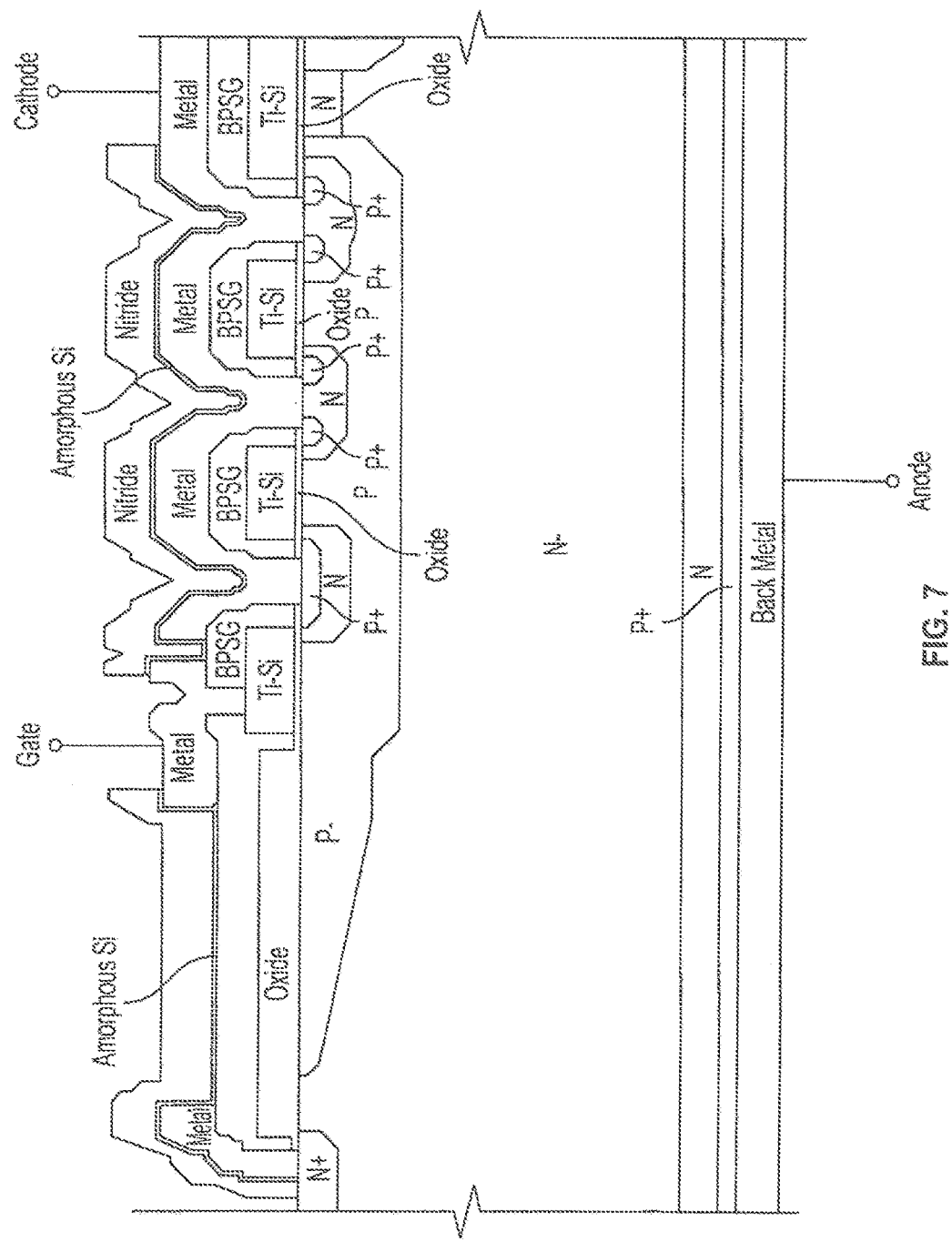
FIG. 7 shows the cross section of the vertical MOS controlled thyristor.
Figure 7A:
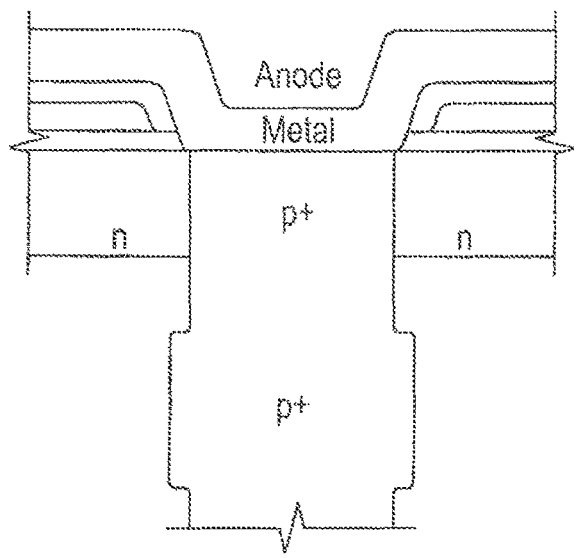
FIG. 7A is a magnified view showing, a vertical sinker that can be used to convert the vertical structure with backside Anode to a device whose anode can be accessed from the top of the wafer as the other terminals are.

The second method utilizes turn off thyristors with a vertical sinker and buried layer to allow a vertical device with all terminals picked up on one side of the wafer. FIG. 7C illustrates an equivalent latch structure for an MCT. Using vertical sinkers with multiple MCTs on a single substrate, while still utilizing the bulk operation of the device for current density improvement allows complete isolation of each turn off thyristor or thyristor subcell. An example is shown in FIG. 7. FIGS. 7A and 7D show the sinker made up of isodown and isoup to pick-up the p buried layer in FIG. 7. This structure may be modified by those skilled in the an but a vertical sinker arrangement to pick up a vertical turn off thyristor structure has not been taught in the past. In the bottom right hand corner of FIG. 7D p+ may be extended for subcells within a given isolated MCT and then the subcells to the left repeated (without the left side terminator for inner cells and with for the end cells) or a dielectric or wide n region may extend through to the bottom of the wafer to isolate MCTs on the same substrate.

Figure 7B:
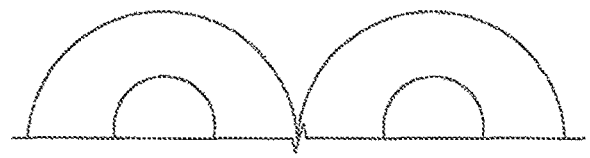
FIG. 7B shows a top half view of how the FIG. in 7A may be reflected symmetrically around a center point.
Figure 7C:
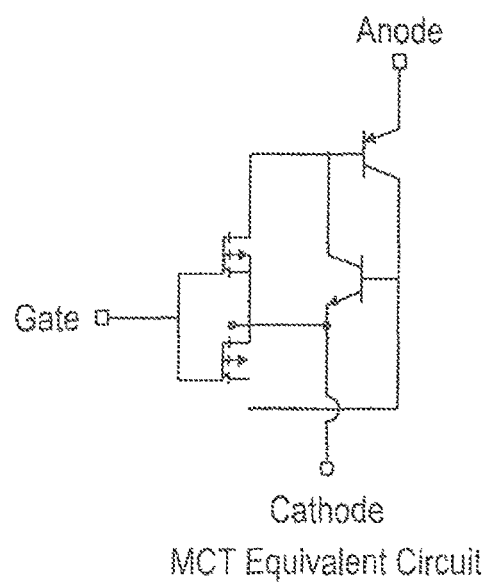
FIG. 7C shows an MCT equivalent circuit.
Figure 7D:
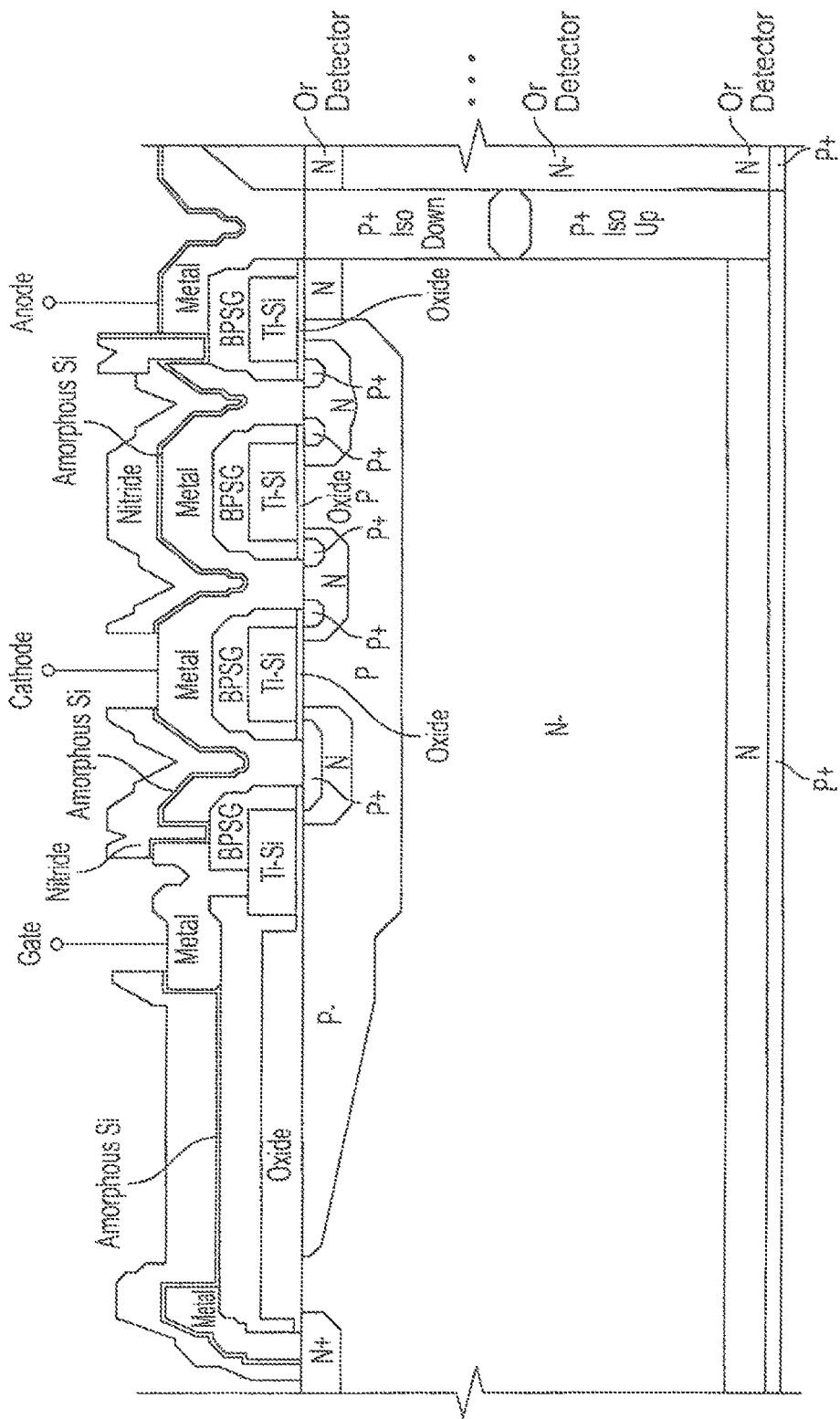
FIG. 7D show how sub-MCT turn off thyristor type sub-cells may be isolated with their Anode connection being brought up to the top side with a sinker.

FIG. 7B shows how the construction could be rotated to produce cells which combine to form an overall power device, while Figure and 7D also shows hoof sub-MCT turn off thyristor type sub-cells may be isolated with the anode brought to the same side of the wafer as the cathodes. These may be turned off using a controller in conformance with an input signal such as the voltage on the gate, or a timed response, or other mechanism to create a linear thyristor which can control the rate of turn on or turn off of the overall turn off thyristor. Such a linear MCT or GTO would be very attractive as the result would have the current handling properties of MOSFETs, IGBTs or Bipolars such that the turn on and turn off time can be modulated so as not to produce excessive ringing or other artifacts.

In addition to the turn off thyristor structures, it is necessary to create optimized drivers that switch quickly while also utilizing the smallest possible drive devices possible. FIG. 8 shows shows such a driver arrangement. Parallel driver arrangements might be utilized and sized so as to stagger the turn off of different subcells to control the turn off transitions conforming to a control signal such as the MCT gate voltage. Coupling capacitors make this driver capable of driving a GTO current trigger device where the current is determined by a combination of capacitor size, level shifter driver device sizes and potentially some low side gate slewing circuitry. FIG. 8a shows a turn off TRIAC arrangement which could be driven by such drivers each conforming to its specific type of thyristor topology (p or n), note that the driver must be referenced to the emitter of the MCT (n being pulled above and p pulled below).

Referring now to FIGS. 1-5, detailed embodiments of the present invention will be disclosed. In all of the figures current is limited by either a servo controlled current source (transconductor), a thyristor operating linearly as taught in this application or utilizing a resistor or other passive. Said transconductor may be easily implemented by an operation amplifier, a bipolar transistor or low voltage MOSFET (protected by thyristor switches), and a resistor with the resistor in negative feedback against a reference voltage as shown in FIG. 2b.

Figure 1A:
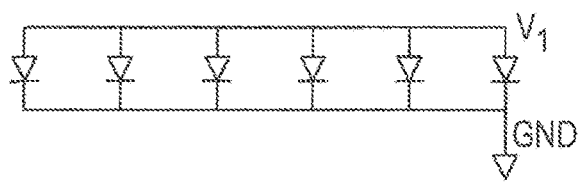
FIG. 1A shows one example of the LED connection using the switching matrix of FIG. 1.
Figure 1B:
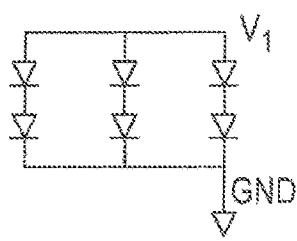
FIG. 1B shows another example of the LED connection using the switching matrix of FIG. 1.
Figure 1C:
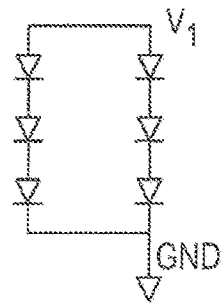
FIG. 1C shows another example of the LED connection, using the switching matrix of FIG. 1.
Figure 1D:
FIG. 1D shows another example of the LED connection using the switching matrix of FIG. 1.
Figure 1:
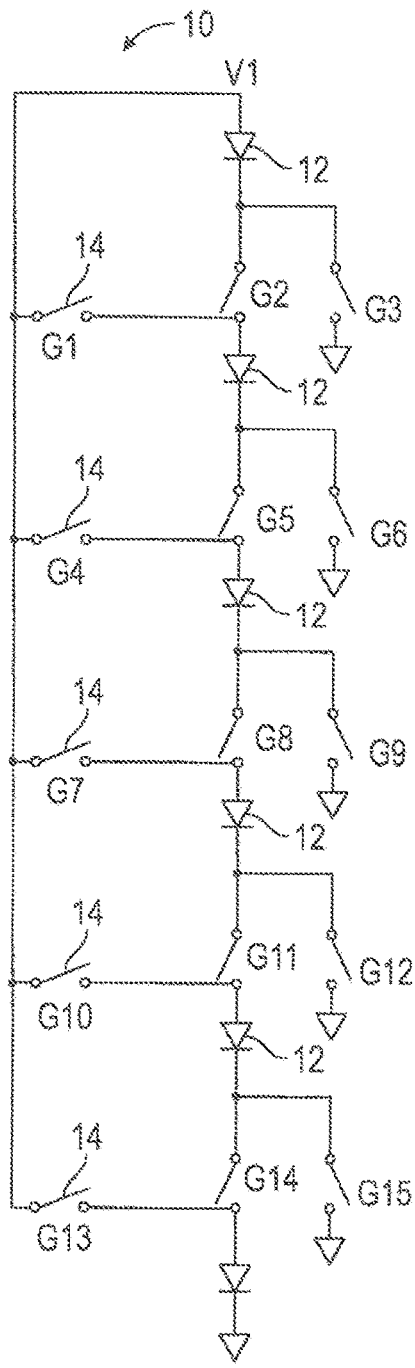
FIG. 1 is a simplified schematic of a switching matrix of the present invention.

Referring to FIG. 1, a switch matrix 10 is shown. The switch matrix 10 may be used to connect one or more Light Emitting Diodes (LEDs) 12 in a plurality of different configurations. While the present embodiment shows six LEDs, additional or fewer LEDs 12 may be used. The switching matrix 10 utilizes a plurality of switches G1-G15 to connect the Light Emitting Diodes (LEDs) 12 in different configurations. The switching matrix 10 may utilize turn off thyristors such as Gate Turn Off (GTO) or Mos-Controlled Thyristor (MCT) transistors for the switches G1-G15 (or combinations thereof in on/off triac form). By opening/closing the switches G1-G15, the switching matrix 10 may be used to create full parallel groups of one or more high brightness LEDs 12 as shown in FIG. 1A. Alternatively groups of parallel combinations of LEDs 12 may be utilized as shown in FIG. 1B and FIG. 1C. The LEDs 12 may also be placed in series as illustrated in FIG. 1D. Those skilled in the art will be able to extend or reduce the combinations as desired to optimize utilization of LEDs 12, reduce flicker and maximize conduction angle.

Referring now to FIGS. 2A-2B, an embodiment of the switching matrix 20 is shown to drive one or more LEDs 12 (See FIGS. 2C-2H). In the switching matrix 20, the switches 14 are connected to a single supply. As in the previous embodiment, the switching matrix 20 may utilize turn off thyristors such as Gate Turn Off (GTO) or Mos-Controlled Thyristor (MCT) thyristors for the switches 14 (or combinations thereof in on/off triac form). In one embodiment the supply to the switches 14 is GND or the lowest circuit potential, in the other it is V1 or the highest potential. When the AC voltage is low a single LED 12 is connected across the input voltage. As the voltage rises a second switch 14 turns on while the first turns off connecting two LEDs 12 to ground, while the first turns on allowing two switches in series. This process continues until all of the LEDs 12 are connected in series across the input voltage in conformance with the AC half wave and then the process reverses as the rectified AC half wave fails back towards zero.

In the embodiment shown in FIGS. 2A-2B, additional current limiting means may be anticipated which might be as simple as a resistor, or use of a linearly controllable turn off thyristor, or may include an additional servo driven transconductor. Referring to FIG. 2I, a transconductor 22 may be inserted in the switching matrix 20. The transconductor 22 may be implemented by using an operation amplifier 24, a lower voltage transistor 26 and a resistor 28 with the resistor 28 in negative feedback against a reference voltage Vr. The transistor 26 may be a bipolar transistor or MOSFET. The transconductor 22 utilizing the lower voltage transistor 26 and relying on the MCTs and GTOs (switches 14) to hold off the voltage. In this case the ground connections shown would instead be the connection A of the transconductor 22. This instantiation may also be utilized by a purely passive valley fill PFC without switches if desired, using any of the common variants known to those skilled in the art from a single capacitor to multiple capacitors Use of even one thyristor turn off capable switch, however, allows adjustment of the valley fill minimum voltage to extend the conduction angle which can be useful especially during phase control dimming.

Figure 3:
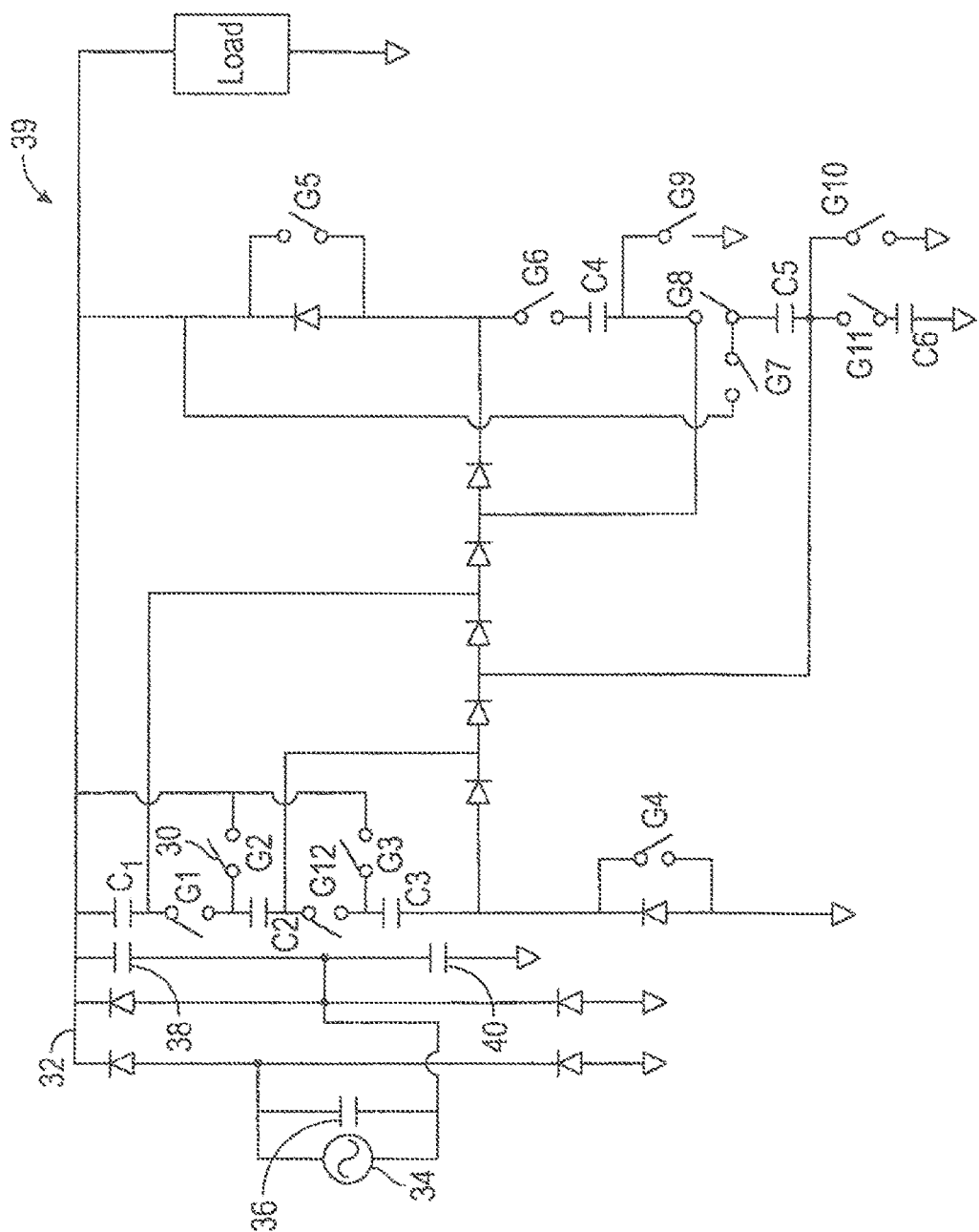
FIG. 3 shows a switching matrix using a valley fill PFC circuit.

Referring now to FIG. 3, a switching matrix 30 is shown using a valley fill PFC circuit 32 with switches G1-G11 added. The PFC circuit 39 may have a AC input 34, a capacitive element 36 coupled in parallel to the AC input 34, a diode bridge rectifier 32 coupled to the AC input 34 and capacitive element 36, and a pair of capacitive elements 38 and 40 coupled to the diode bridge rectifier 32 and negative terminal of AC input 34. Capacitor 36 compensates the fundamental reactive power and absorbs the harmonic distortion power to yield higher power factor and low total harmonic distortion. Capacitive elements 38 and 40 increase the conduction time of the input current by providing an alternate path for input current to flow into the circuit before the input line voltages increases above the valley fill voltage reducing current distortion. As in the previous, embodiments, the switches G1-G11 may be turn off thyristors such as Gate Turn Off (GTO) or Mos-Controlled Thyristor (MCT) transistors (or combinations thereof in on/off triac form). It is possible to utilize none of the shown MCT-GTO or turn off TRIAC switches G1-G11 in the valley fill PFC scheme (back to back GTO or MCT to allow bidirectional conduction) or a limited combination and the benefits of doing so are easily understood by those skilled in the art. Specifically, increasing the conduction angle for charging and discharging as well as allowing re-distribution of the capacitor for use as an offline charge pump.

Figure 3A:
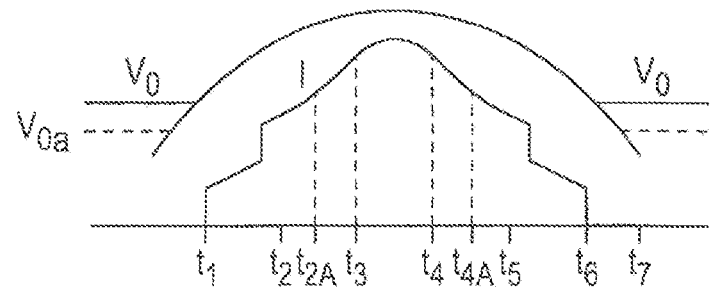
FIG. 3A shows an operation operating waveforms of the switching matrix of FIG. 3.

Referring now to FIG. 3A, operation operating waveforms of the switching matrix 30 is shown. The upper waveform is the input voltage and the output voltage except that Vo or Voa shows the valley fill voltage which differs from the rectified input voltage during the valleys. The lower waveform shows the input current from the AC input 34. The improved power factor and Total Harmonic Distortion (THD) is evident as the input current 1 follows the in AC half wave far better than would a conventional peak charging capacitor.

Before t1 the load, LEDs 12, is being entirely supplied by the valley fill capacitors C1 and/or C6 (if G11 closed) or C5 if G7 is closed as well with G10 closed. During t1-t2 the input voltage exceeds the valley fill capacitance and starts charging C1 and supplying the load, then as the voltage rises we close G11 and open G10 to charge capacitors C1+C6 as well as the load. During t2-t2a we close G1 and G8 which charges some combination of C1+C5+C6 or C1+C2+C6 depending on which is discharged the most and for some period in parallel. From t2a-t3 we close G12 and G6 and some combination of the upper three capacitors (C1-C3) and C6 or the lower three capacitors (C4-C6) and C1 are charged. Charge balancing will basically ensure that all possible conduction paths displace to maximize the relative voltage across the capacitors against their size in a capacitor divider. Note that if the impedance of the switches is too low then resistors may have to be added in series with the diodes to lengthen the conduction time. Also note that fewer switches may be used but if even a single switch is used then the valley fill voltage may be lowered improving the conduction angle.

From, t3-t4 the capacitors C1-C6 (all the capacitors) will charge and the load will be fed directly until peak voltage is reached after which the output will still be fed by a combination of the capacitors C1-C6 and the load since the capacitors C1-C6 are sized to minimize the valley fill voltage. From t4 to t4a this will continue as it will from t4-t5 and t5-t6. After t6 the voltage is smaller than the valley fill voltage and the valley fill capacitors will provide all of the output current while nothing will flow from the input. Improving the input current drawn from the AC line during this time requires a load across the supply independent of the valley fill and load as shown in FIG. 3 36.

The result of splitting up the capacitance this way is an extension of the conduction angle. The switches allow utilization of 1-3 three capacitors on the upper and lower portions which allow adjustment of the valley fill voltage if desired. Additionally it may be useful to simply utilize fewer capacitors or to use a single capacitor and pin out its plates so that the result looks like multiple capacitors.

Figure 3B:
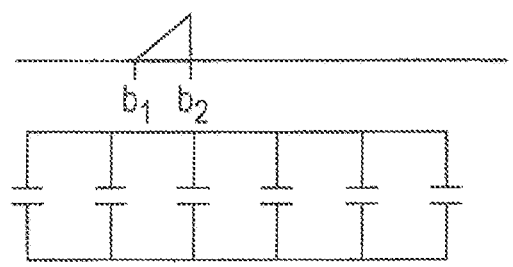
FIG. 3B shows how the capacitors may be rearranged in a parallel combination to utilize multiple capacitors to store charge to keep the system powered during low dimming levels of phase control dimming from $t_1$-$t_2$.

If phase control dimming is used as shown in FIG. 3B, then, the capacitors C1-C6 may be rearranged in a parallel combination or series parallel combination depending upon the input voltage to keep the circuit alive during the dead times from t6 to t1 in FIG. 3A. This energy can also be replenished by switching from parallel to a parallel series combination to charge the capacitors with a low input voltage but still supply enough voltage to maintain the minimum system voltage (such as for the control IC) in an offline charge pump type scheme (higher frequency than line voltage rearrangements of capacitors to conform to the input voltage during part of a cycle and to an output voltage during another portion of the higher frequency cycle). This can drive the load as well or alternatively may be used to keep the control circuitry alive if the conduction angle becomes very small. Either way the use of phase control dimming is facilitated through the use of these switches G1-G11 due to the ability to re-arrange the capacitors in series and parallel combinations conforming the the input voltage and the output voltage desired at low dimming levels or as a keep alive.

Figure 4A:
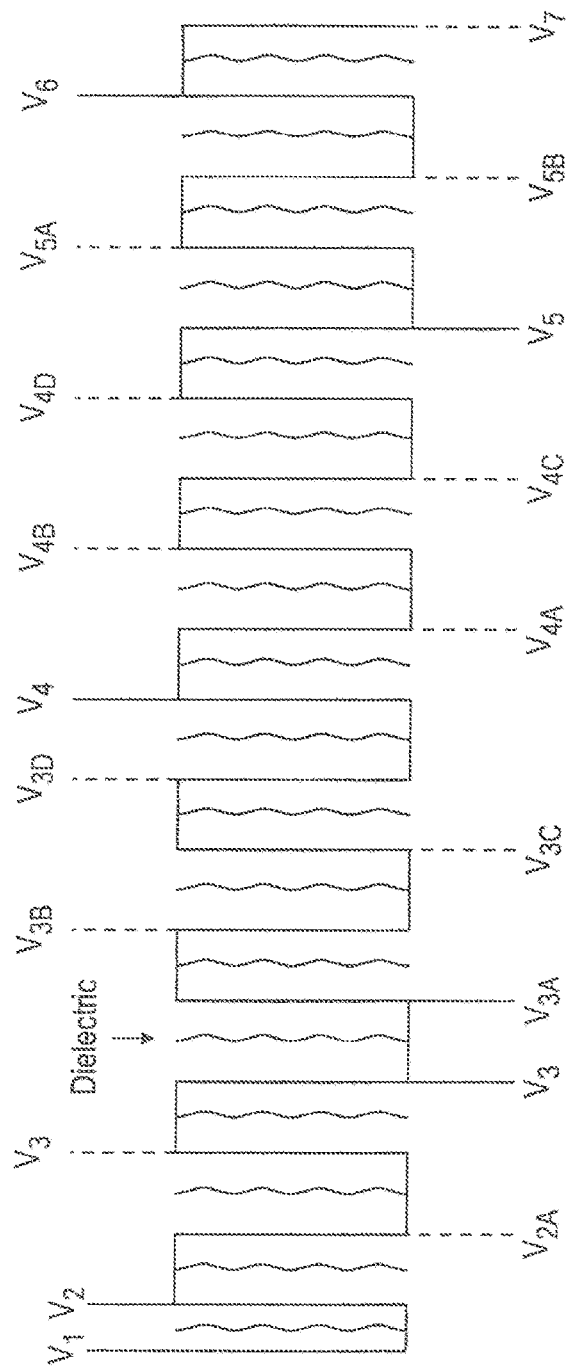
FIG. 4A shows a novel capacitor construction for the capacitors of the previous embodiments.
Figure 4B:
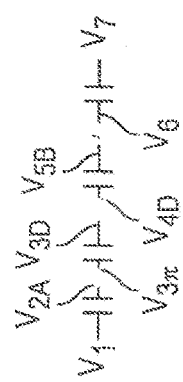
FIG. 4B shows a simplified schematic of the novel capacitor construction as shown in FIG. 4A.
Figure 5:
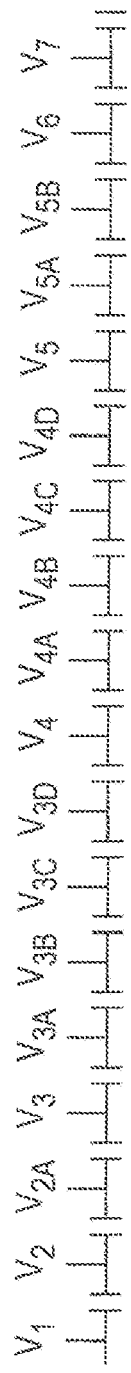
FIG. 5 shows the capacitor construction for use in an offline capacitor configuration.
Figure 6:
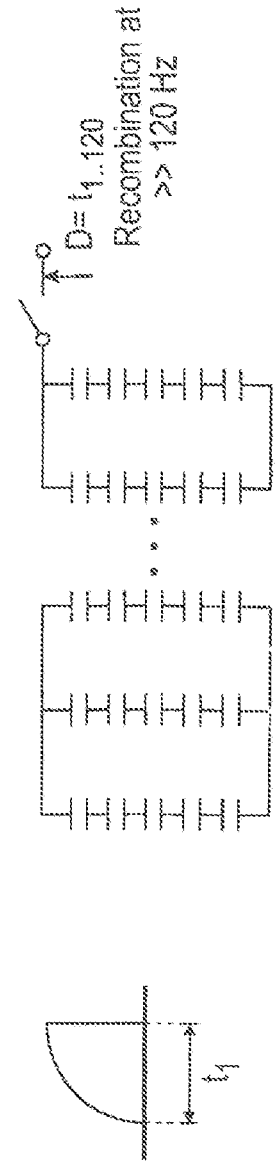
FIG. 6 shows the capacitors of FIG. 3 connected in parallel during part of the cycle indicated by $t_1$ which will then be connected in a series or series parallel combination to an output capacitor and/or load during another portion of the cycle, then an arbitrary voltage may be created by pumping from any part of the AC input line to a desired output voltage.

Referring to FIG. 4A-4B, an example of a novel capacitor construction for the capacitors C1-C6 of the previous embodiment is sheer. The capacitor construction takes the multiply folded plates in standard capacitors and makes them available for connection in either valley fill PFC combination disclosed above. Alternatively the same construction may be used to create the offline capacitor as shown in FIG. 5. For example if all of the capacitors (C1-C6 FIG. 3) are connected in parallel during part of the cycle and then connected to an output capacitor and/or load during another portion of the cycle, then an arbitrary voltage may be created by pumping from any part of the AC input line to a desired output voltage. Not only does this facilitate a voltage mode offline charge pump but with proper selection of the intermediate voltage it allows a phase control signal to be pumped to an intermediate voltage as shown in FIG. 6. Rather than relying on a flickering 120 Hz signal, the faster charge pump rate may control a duty cycle such that the system only connects to the load using a duty cycle correlating to a linearized replica of the phase control signal, as a fraction of the overall half other such control function, but at higher frequency which is not detectable by the eye.

There are a variety of methods translating a phase control signal to a duty cycle, including, a direct linear representation which is non-ideal due to eye sensitivity as well as the properties of a sine wave. Said translation transfer functions may utilize the arias setting from previous cycles to assume a given triac setting such that new combinations of capacitors may be used to store energy to optimize the transfer function as described above or to store maximal energy to keep the control circuitry alive for very small or vanishing phase angles.

FIG. 7 and FIG. 7A show a vertical sinker structure for an n-MCT. FIG. 7 shows a vertical arrangement with the substrate being the anode. This arrangement is useable for the common terminal array discussed above, however, for full switching of either the offline charge pump configuration or the more complex LED switching arrangements (or a combination of the two) the MCT needs to be isolated. These structures nay be isolated by inserting sinkers utilizing isoup and isodown as shown in FIG. 7A and FIG. 7D. FIG. 7A shows this arrangement and FIG. 7D shows the sinker inserted into the structure. This arrangement brings the buried layer r anode terminal up to the surface. By separating the MCTs subcells as shown in FIG. 7D (another subcell is continued to the right without the long p-terminator again and again with a final subcell including a mirror image of the FIG. 7 cell including deep-tapered terminator and associated termination elements) it is possible to create multiple isolated MCTs on the same substrate with separated anode, cathode and gate terminals which has not been done before.

The operation of the MCT is easily understood by considering the MOSFETs formed by the n-channel n/p+/n structure in the area to the left of the n region on the right side and the p+/n/p p-channel arrangement under the BPSG/TiSi/SiO2 stacks. The TiSi are the gates. When the gate is positive, the n-channel will inject carriers into the n drift region (n−) to trigger the n/p+/n−/n/p+ scr structures while if the gate voltage is pulled negative then the p-channel will effectively short the base-emitter voltage of the npn device in the equivalent circuit of a bipolar latch. Control of the drift region, gold doping and irradiation to create sites for recombination can increase the rate of turn off the devices.

FIG. 7B shows how the construction could be rotated to produce a cell which can be repeated to create a large power device.

FIG. 7D can also be used to illustrate that subcells within the MCT may be coupled to a controller responding to a control signal, such that the gates formed by the Ti—Si areas turn on or off in succession in time or their gates are charged or discharged at different rates, to control the rate of turn on and off of the MCT. It is important, however, to ensure that the current through the cells which are on does not grow excessive as they will thermally run away. By ensuring that none of the cells runs away at too fast a pace relative to one another, a controller may use the turn on/turn off capability of the MCT injecting mechanism to control the spreading of the turn on or off of subcells to create a quasi-linear device. This is useful as it would be possible to turn on or off the device or modulate the current in a way more like a MOSFET or IGBT or alternatively to turn an only a portion of the device to reduce switching losses.

FIG. 8 illustrates a driver 80 for the MCT, GTO or linear/controlled turn on type devices described above. Multiple drivers are illustrated in this drawing and would likely not be combined in a real implementation (to the left a scr current driver is connected), to the right different time or charge rate staggered high impedance gate turn on mechanisms are shown to control turn on of different subcell elements). Those skilled in the art would separate these methods. In all cases a level shift 82 with cascodes is used to protect the gates of the high voltage MOSFETs. Resistors (rectangles) may be used to degenerate the low side switches to change the driver switch rate/current through the capacitors to current driven devices or may be left out. In addition, time constant or size variations may be used to control multiple mirror elements turning on different subcells similar to 7D. The upper cascodes connected to the gates of the high voltage p-channel level shifter devices cascode the gates of the level shift devices themselves while the p-cascades below the level shift crisscross connection to protect the gates of the devices being driven. Similarly the n-channel cascodes protect the low voltage devices connected to the inverter and control terminal at the bottom. This scheme can be extended utilizing differently sized cascade mirrors in parallel to control the turn on and turn of schemes to control the current rise and fall in conformance with a control signal such as the MCT gate voltage so that the devices operate more like MOSFETs or IGBTs (utilizing the subcells described above). For example with wide swing cascade mirror elements of different sizes, the mirrors may be setup for the different devices such that the current charging the distributed gates may be fanned out differently to said subcells to control said turn on and off rates and further may be coupled with feedback to said voltage measurement circuits of the individual cells to ensure no hotspots occur or to create constant current operation. Alternatively, RC time constants may be distributed between the mirrors as shown (CA or CB) to control turn on or turn off rates. Ie. if differently sized RCs are coupled to each of the mirrored output devices which are in turn connected to the distributed gates of the turn off thyristors then a linear in time turn on or turn off may be accomplished allowing the MCT to more closely resemble a MOSFET or IGBT with a linear region (which can help reduce ringing and eliminate snubbers). Both the time constant altered cell turn on, or current staggered turn on to vary the rate of turn on and off of the cells, or a combination, is a means by which to control the plasma spreading or current turn on rate of the devices and produce a quasi-linear response. Those skilled in the art will understand that the low side needs to be replicated for turn off even though only the upper cascade mirror elements are explicitly drawn.

Utilizing capacitors coupled to GTOs allows the driver configuration in FIG. 8 to be utilized for current triggered devices where the size of the switch devices in the level shift, degeneration of the switch devices, size of coupling capacitors or tunable/controllable capability of any of these elements may be used to control the dv/dt such that the trigger current may be tailored for said GTOs.

FIG. 8a illustrates the concept of a turn off TRIAC utilizing gated off thyristors to control a bidirectional current.

Referring to FIG. 9, the benefits in current density of an MCT vs. other types of devices is shown. FIG. 9 illustrates that MCTs have a higher current density which translates into less silicon. This differs from conventional direct drive means which generally utilize external MOSFETs to short groups of LEDs during different segments of AC waveform. Simply utilizing these types of devices, however, may not be enough as it may be necessary to combine them on a single substrate while simultaneously isolating to make them useful. Isolated arrays of these types of thyristors have not been taught before.

FIG. 10 illustrates operation of the offline charge pump where capacitors are arrayed from all parallel to series-parallel to fully series operation in conformance with the magnitude of the AC input voltage, but re-configured to meet an output voltage conforming to that required by the load and/or an output capacitor at a frequency much higher than the frequency of the offline signal.

FIG. 11 illustrates some applications in which an offline charge pump might be used and the advantages that would accrue.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A thyristor array comprising:
   an array of MCT or GTO thyristors;
   wherein the MCT or GTO thyristors are formed on a common substrate, with one of a common anode or cathode connected to the common substrate, for MCT or GTO thyristors in the array;
   a buried P layer formed on the common substrate; and
   a vertical sinker formed on the common substrate, the vertical sinker isolating individual MCT or GTO thyristors of the array of MCT or GTO thyristors.

2. A thyristor array formed on a common substrate comprising:
   a plurality of isolated vertical structure turn off thyristors, wherein each of the turn off tyristor is one of a MCT, GTO, or turn off TRIACs;
   wherein each of the plurality of vertically structure turn off thyristors has isolated terminals and is isolated from the other turn off thryistors; and
   a vertical sinker formed on the common substrate, the vertical sinker isolating each of the plurality of isolated vertical structure turn off thyristors.

3. The thyristor array of claim 1, wherein the vertical sinker comprises isoup and isodown structures to pick-up the buried P layer.

4. The thyristor array of claim 2 comprising a buried P layer formed on the common substrate.

5. The thyristor array of claim 4 wherein the vertical sinker comprises isoup and isodown structures to pick-up the buried P layer.

* * * * *